US007009898B2

(12) United States Patent
Lee et al.

(10) Patent No.: US 7,009,898 B2
(45) Date of Patent: Mar. 7, 2006

(54) PSRAM FOR PERFORMING WRITE-VERIFY-READ FUNCTION

(75) Inventors: Sang Kwon Lee, Yongin-si (KR); Tae Woo Kwon, Gyeongsangnam-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 39 days.

(21) Appl. No.: 10/876,778

(22) Filed: Jun. 28, 2004

(65) Prior Publication Data

US 2005/0201167 A1    Sep. 15, 2005

(30) Foreign Application Priority Data

Mar. 11, 2004  (KR) .................. 10-2004-0016539

(51) Int. Cl.
*G11C 7/00* (2006.01)
(52) U.S. Cl. ...................................... 365/201; 365/222
(58) Field of Classification Search ................ 365/201, 365/203, 222
See application file for complete search history.

(56) References Cited

U.S. PATENT DOCUMENTS 5,471,430 A * 11/1995 Sawada et al. ............. 365/222
5,550,394 A *  8/1996 Sukegawa et al. .......... 257/209
5,590,086 A * 12/1996 Park et al. .............. 365/230.03
5,625,597 A *  4/1997 Hirose ....................... 365/201

* cited by examiner

*Primary Examiner*—Michael Tran
(74) *Attorney, Agent, or Firm*—Heller Ehrman LLP

(57) ABSTRACT

A PSRAM performs a Write-Verify-Read function at a test mode, thereby easily analyzing defects. The PSRAM comprises a test mode decoder, a refresh control block and a precharge control block. The test mode decoder generates a test mode control signal for performing a WVR function when a test mode starts. The refresh control block selectively performs a refresh operation in response to the test mode control signal. The precharge control block selectively performs a precharge operation in response to the test mode control signal outputted from the test mode decoder. Here, the test mode control signal is activated at the test mode so that the refresh operation and the precharge operation are not performed.

4 Claims, 4 Drawing Sheets

PSRAM FOR PERFORMING WRITE-VERIFY-READ FUNCTION

BACKGROUND OF THE INVENTION

1. Field of the Invention

The present invention generally relates to a Pseudo Static Random Access Memory (hereinafter, referred to as "PSRAM"), and more specifically, to a PSRAM for performing a Write-Verify-Read (hereinafter, referred to as "WVR") function at a test mode to easily analyze defects.

2. Description of the Prior Art

Generally, a Dynamic Random Access Memory (hereinafter, referred to as "DRAM") memorizes information with charges in a cell capacitor, transmits accumulative charges to a corresponding bit line through an access transistor, and reads data amplified by a sense amplifier.

Since a memory cell of the DRAM that comprises one access transistor and one cell capacitor occupies a small area, a memory of high capacity can be embodied with the small area.

FIG. 1 is a timing diagram illustrating the operation of a conventional DRAM for performing a WVR function.

Referring to FIG. 1, after a word line WL corresponding to a row address RADD is activated by a command /RAS, a write command WR and a read command RD are successively inputted to the same column address CADD in response to a command /CAS and a write active command /WE. Then, a column operation is successively performed while the word line WL is activated. In this way, the WVR function is performed.

Meanwhile, a memory device becomes smaller for high-speed operation of the memory device, reduction of consumed current and miniaturization of the processing system. As the memory device becomes smaller, a memory cell capacitor also becomes smaller so that capacity of the memory cell capacitor is reduced. As a result, the amount of retention charges becomes smaller although data having the same voltage level are inputted to the capacitor.

In order to compensate the reduction in the amount of retention charges, a refresh operation is periodically performed. In the refresh operation, data stored in the memory cell capacitor are transmitted to a bit line, amplified in a sense amplifier, and then re-written in the memory cell capacitor.

As a result, when data retention characteristics are degraded in the miniaturized device, a refresh cycle is required to be set short in order to compensate the degradation of the data retention characteristics. However, when the refresh cycle is set short, an external processing unit cannot access the DRAM during the refresh operation, thereby degrading the performance of the processing system. Additionally, the amount of consumed current for performing the refresh operation increases when the refresh cycle becomes short. The short refresh cycle does not satisfies the low standby current condition required in a data retention mode of battery driving portable devices, and is not applied to the battery driving portable devices which require low power consumption.

In order to solve the problem of the refresh operation in the DRAM, a PSRAM has been used to operate the DRAM as a SRAM. In the PSRAM, a cycle for reading and writing data and a refresh cycle for performing a refresh operation are successively performed in one of memory access cycles. In other words, since the refresh operation is performed in one access cycle, the refresh can be hidden to the external access so that the DRAM may be operated as the SRAM seemingly.

FIG. 2 is a timing diagram illustrating the operation of a conventional PSRAM for successively performing write and read operations.

Referring to FIG. 2, when row and column addresses ADD are simultaneously inputted, the word line WL activated at the write mode is automatically precharged if the write active command /WE is inactivated to the high level. Then, the word line WL is activated and the read operation RD is performed. As a result, the WVR function for performing only the column operation while the word line WL is activated cannot be performed.

In other words, since the PSRAM does not have the precharge command, a self-refresh operation is performed at the read mode. The PSRAM performs the precharge operation when the write active signal /WE or the chip selecting signal /CS is inactivated to a high level at the write mode WR.

Since a row address and a column address are simultaneously inputted like in the DRAM, the WVR function for alternately performing write WR and read RD operations cannot be performed while the word line WL is activated in the conventional art.

SUMMARY OF THE INVENTION

It is an object of the present invention to perform a WVR function at a test mode, thereby easily analyzing defects.

In an embodiment, a PSRAM comprises a test mode decoder, a refresh control block and a precharge control block. The test mode decoder generates a test mode control signal for performing a WVR function when a test mode starts. The refresh control block selectively performs a refresh operation in response to the test mode control signal. The precharge control block selectively performs a precharge operation in response to the test mode control signal outputted from the test mode decoder. Here, the test mode control signal is activated at the test mode so that the refresh operation and the precharge operation are not performed.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
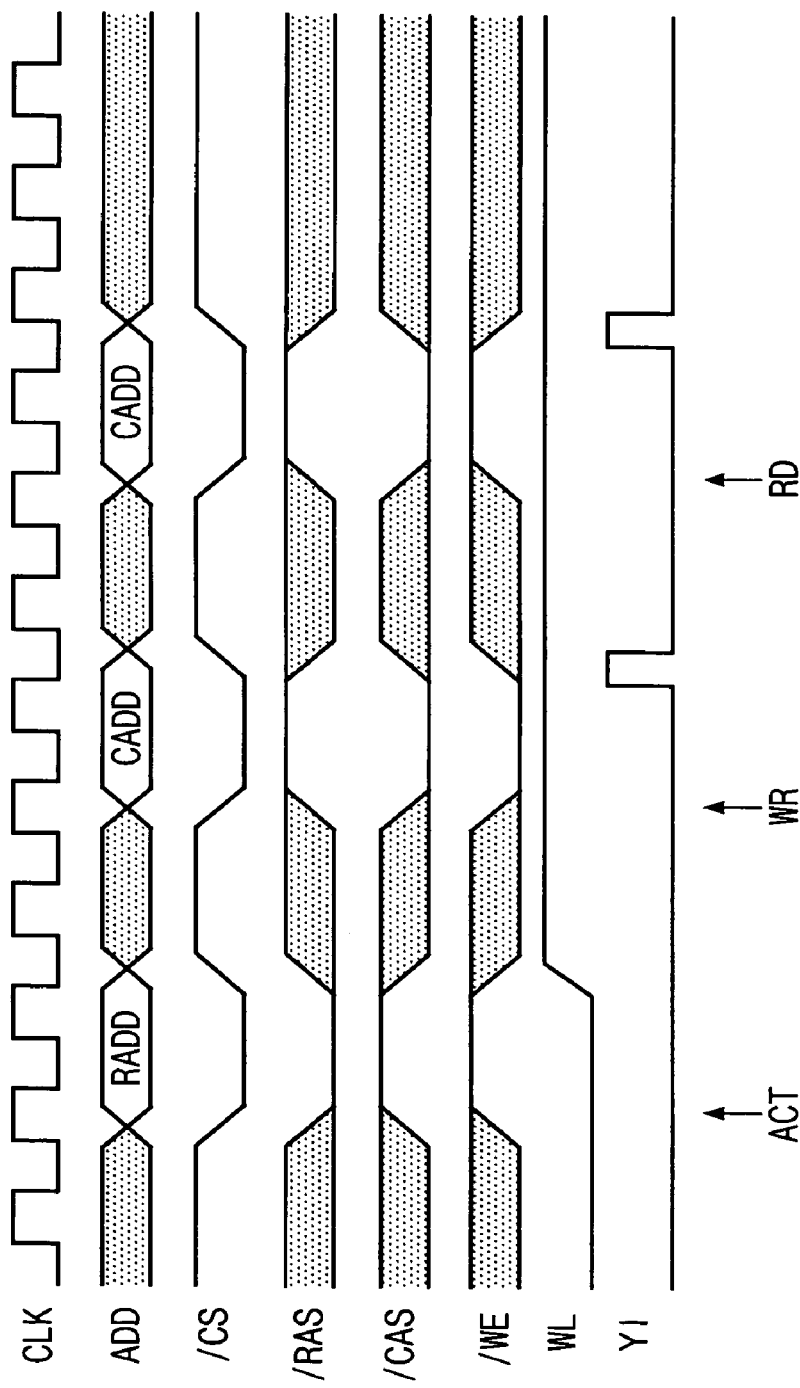
FIG. 1 is a timing diagram illustrating the operation of a conventional DRAM for performing a WVR function.
Figure 2:
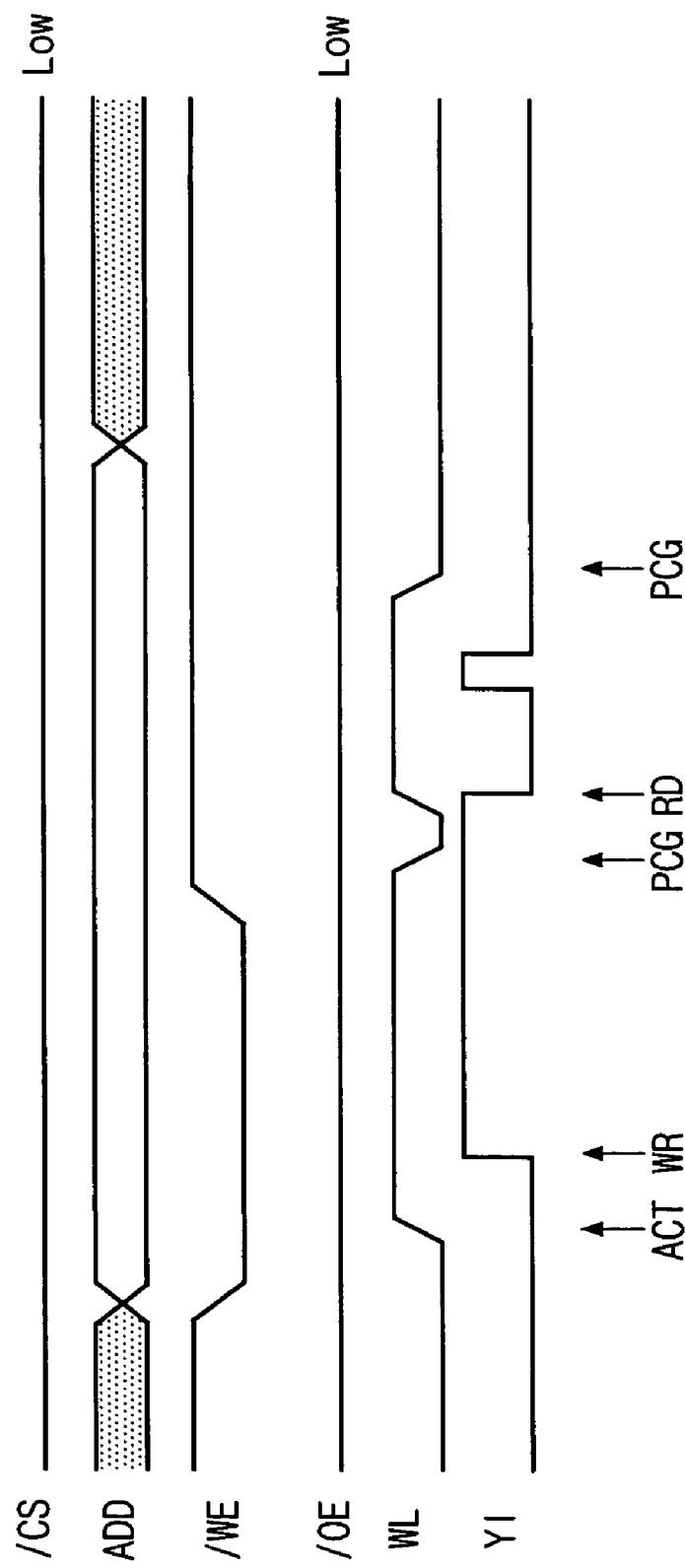
FIG. 2 is a timing diagram illustrating the operation of a conventional PSRAM for successively performing write and read operations.
Figure 3:
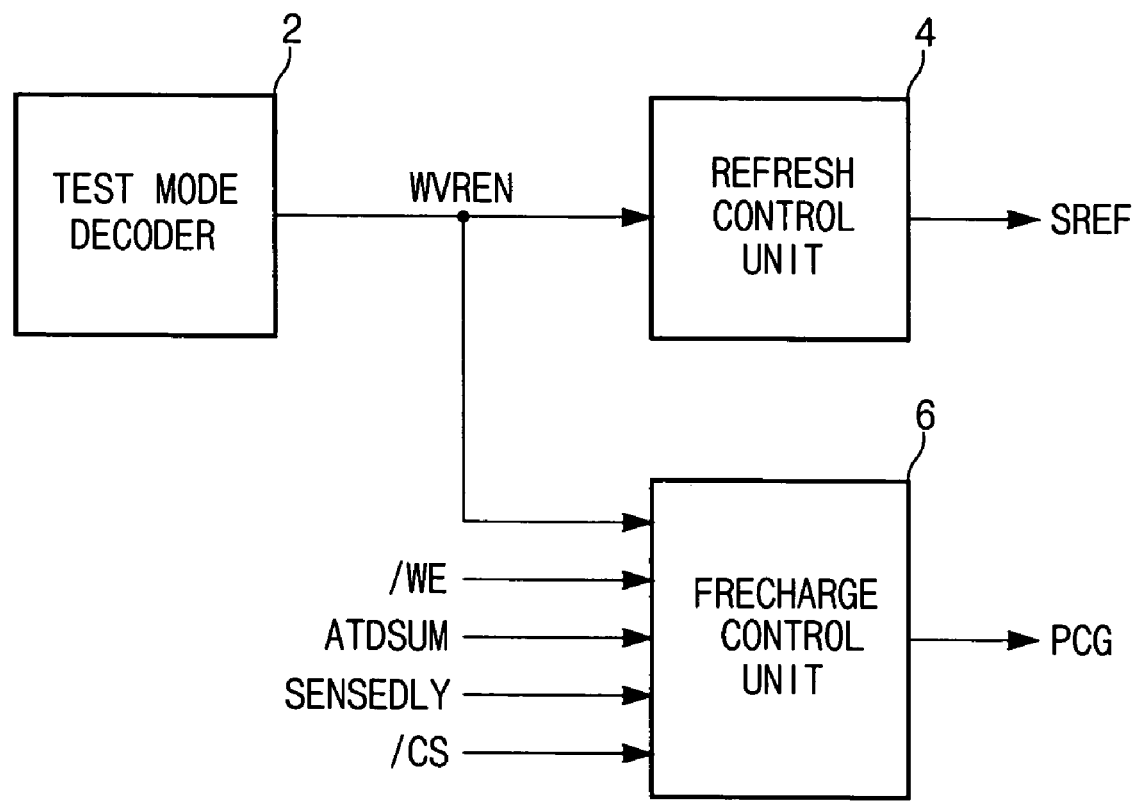
FIG. 3 is a block diagram of a PSRAM according to an embodiment of the present invention.

FIG. 3 is a block diagram of a PSRAM according to an embodiment of the present invention.

In an embodiment, the PSRAM comprises a test mode decoder 2, a refresh control unit 4 and a precharge control unit 6.

When a test mode starts, the test mode decoder 2 generates a test mode control signal WVREN for forming a WVR function. Here, the test mode control signal WVREN is inputted to the refresh control unit 4 and the precharge control unit 6 so that an internal refresh operation SREF is not performed, and an active operation by a write active command /WE or a precharge command PCG is not performed if the test mode control signal WVREN is activated.

Figure 4:
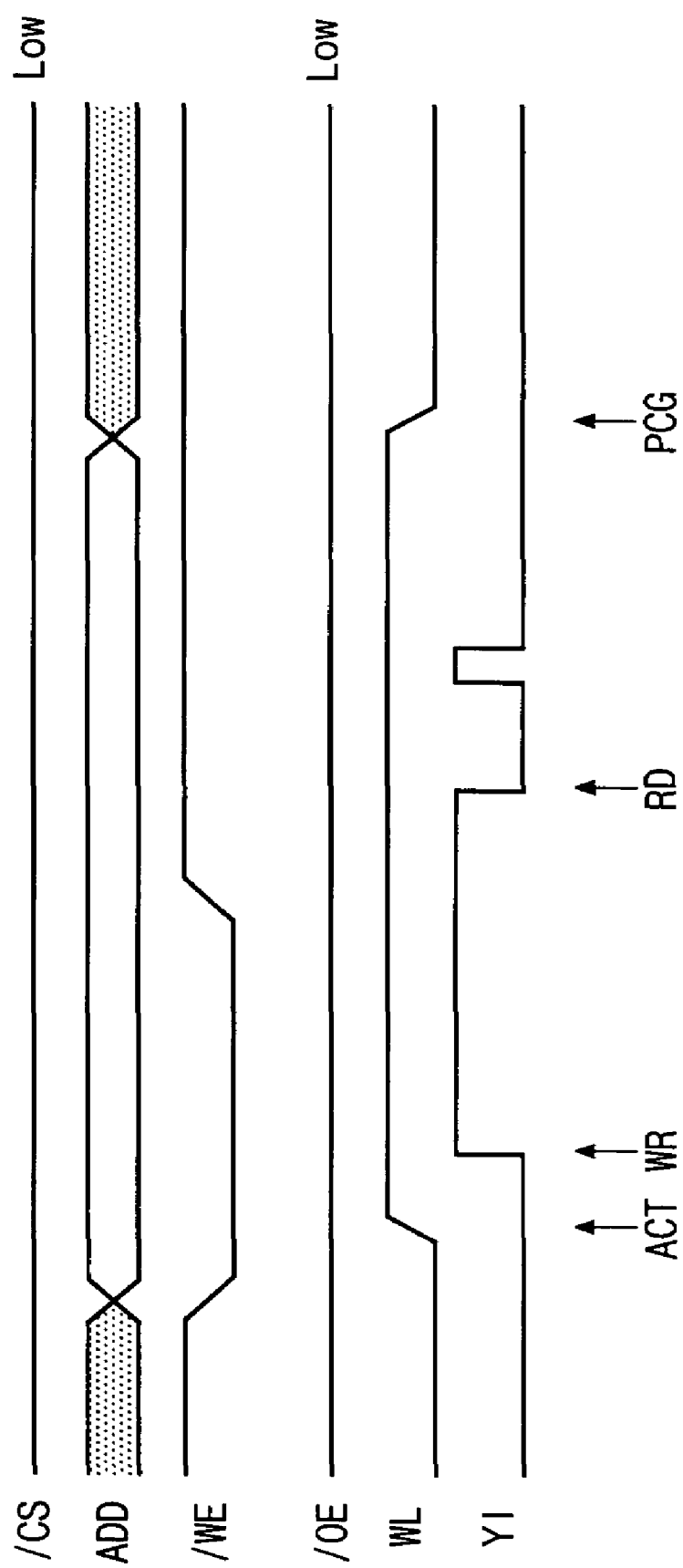
FIG. 4 is a timing diagram illustrating the operation of the PSRAM of FIG. 3 for performing a WVR function.

FIG. 4 is a timing diagram illustrating the operation of the PSRAM of FIG. 3 for performing a WVR function.

Referring to FIG. 4, when an address ADD transits, an address transition detecting signal ATDSUM is generated. A word line active command ROWACT and an address strobe signal ADDSTB are activated in response to the address transition detecting signal ATDSUM.

If a word line WL is activated by the word line active command ROWACT, since the test mode control signal WVREN has been activated, the precharge command PCG is not activated even when a self-delay signal SENSEDLY is activated. As a result, the precharge operation is not performed on the activated word line WL.

Meanwhile, if the write active command /WE is activated to a low level, a write command WR is generated so that a column selecting signal YI is maintained at a high level during the write operation. As a result, test data are stored in a memory cell.

Thereafter, since the test control signal WVREN is activated although the write active command /WE has been inactivated to a high level, the precharge command PCG is not generated so that the precharge operation is not performed.

If the write active command /WE is inactivated to the high level, a read command RD is generated to inactivate the column selecting signal YI. After a predetermined delay time, the column selecting signal YI is activated again to perform a read operation.

After the above-described operation is completed, the address ADD is transited again after a predetermined period tRC. Then, the previously activated word line WL is precharged, and a word line corresponding to a new address is activated.

As described above, when the test mode starts, the test control signal WVREN is activated. Although the write active command /WE is inactivated to the high level, the precharge command PCG is not generated and the precharge operation is not performed. As a result, the WVR function is performed.

As discussed earlier, a PSRAM according to an embodiment of the present invention can perform a WVR function with a test mode. Additionally, the WVR function according to an embodiment of the present invention is performed to easily analyze defects. As a result, the easy defect analysis reduces a product developing period, thereby reducing cost.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A PSRAM comprising:
   a test mode decoder for generating a test mode control signal for performing a Write-Verify-Read function at a test mode;
   a refresh control block for selectively performing a refresh operation in response to the test mode control signal; and
   a precharge control block for selectively performing a precharge operation in response to the test mode control signal,
   wherein the test mode control signal is activated at the test mode so that the refresh operation and the precharge operation are not performed.

2. The PSRAM according to claim 1, wherein the precharge control block does not perform the precharge operation when a write active command is inactivated while the test mode control signal is activated.

3. The PSRAM according to claim 2, wherein the precharge control block does not perform the precharge operation when a self-delay signal is activated after read and write operations are performed while the test mode control signal is activated.

4. The PSRAM according to claim 1, wherein the precharge block performs the precharge operation on a currently activated word line when an address transits to generate an address transition detecting signal.

* * * * *